(12) United States Patent
Herbert et al.

(10) Patent No.: US 12,260,038 B2
(45) Date of Patent: Mar. 25, 2025

(54) OPERATING DEVICE, IN PARTICULAR FOR AN ELECTRONIC HOUSEHOLD APPLIANCE, ELECTRONIC HOUSEHOLD APPLIANCE, AND METHOD FOR OPERATING AN OPERATING DEVICE

(71) Applicant: Diehl AKO Stiftung & Co. KG, Wangen (DE)

(72) Inventors: Thomas Herbert, Allgäu (DE); Andreas Maigler, Dieterskirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 148 days.

(21) Appl. No.: 18/071,730

(22) Filed: Nov. 30, 2022

(65) Prior Publication Data

US 2023/0168762 A1 Jun. 1, 2023

(30) Foreign Application Priority Data

Nov. 30, 2021 (DE) .................. 10 2021 131 373.2

(51) Int. Cl.
*G06F 3/041* (2006.01)
*G06F 3/01* (2006.01)
*H05K 5/03* (2006.01)

(52) U.S. Cl.
CPC ............ *G06F 3/0416* (2013.01); *G06F 3/017* (2013.01); *H05K 5/03* (2013.01)

(58) Field of Classification Search
CPC ......... G06F 3/0416; G06F 3/017; H05K 5/03; G01B 7/22
See application file for complete search history.

(56) References Cited

U.S. PATENT DOCUMENTS

| 9,322,634 | B2 | | 4/2016 | Reimann | |
|---|---|---|---|---|---|
| 9,335,828 | B2 | * | 5/2016 | Aaron | G08C 23/04 |
| 9,477,313 | B2 | * | 10/2016 | Mistry | G06F 3/017 |
| 2015/0008943 | A1 | * | 1/2015 | Reimann | G01B 7/004 |
| | | | | | 324/684 |

FOREIGN PATENT DOCUMENTS

| DE | 102019008303 A1 * | 6/2021 | ............ H03K 17/02 |
|---|---|---|---|
| EP | 2822181 B1 | 10/2015 | |

* cited by examiner

*Primary Examiner* — Jermele M Hollington
*Assistant Examiner* — Taqi R Nasir
(74) *Attorney, Agent, or Firm* — Laurence A. Greenberg; Werner H. Stemer; Ralph E. Locher

(57) ABSTRACT

An operating device for an electronic household appliance has at least one touch switch each formed by a respective operator panel of a cover plate, and a touch sensor system for detecting contact with and/or proximity to the operator panel. A control device evaluates sensor signals generated by the touch sensor system. At least one additional sensor system which can detect shaking and/or deformation of the cover plate due to touch provides clearer verification of a contact made with an operator panel. The control device is also configured to evaluate sensor signals generated by the additional sensor system and to combine evaluations of the sensor signals of the touch sensor system and the additional sensor system to detect contact with the operator panel. An electronic household appliance and a method for operating an operating device are also provided.

7 Claims, 3 Drawing Sheets

OPERATING DEVICE, IN PARTICULAR FOR AN ELECTRONIC HOUSEHOLD APPLIANCE, ELECTRONIC HOUSEHOLD APPLIANCE, AND METHOD FOR OPERATING AN OPERATING DEVICE

CROSS-REFERENCE TO RELATED APPLICATION

This application claims the priority, under 35 U.S.C. § 119, of German Patent Application DE 10 2021 131 373.2, filed Nov. 30, 2021; the prior application is herewith incorporated by reference in its entirety.

FIELD AND BACKGROUND OF THE INVENTION

The present invention relates to an operating device, in particular an operating device for an electronic household appliance, with one or more touch-sensitive and/or proximity-sensitive touch switches. The invention also relates to an electronic household appliance and a method for operating an operating device.

Operating devices for household electronic appliances (for example, laundry treatment equipment, dishwashers, refrigerators and/or freezers, hobs or cook tops, stoves, microwave ovens, etc.) often have touch-sensitive and/or proximity-sensitive touch switches, which when touched or approached allow a user, for example, to initiate certain switching operations or change device settings. The touch switches are usually formed by an operator panel of a cover plate and a corresponding touch sensor system for detecting contact with and/or proximity to the operator panel, wherein a capacitive or optical technology is often used for the touch sensor system. Since the sensor signals generated by such touch sensor systems also depend strongly on the environment (e.g. brightness, temperature, etc.) as well as the physical characteristics of the user (e.g. skin color, skin composition, whether gloves are worn, etc.), those systems often tend to be imprecise in the detection of states, which in some cases causes the operator action to be detected too early, too late, or not at all.

SUMMARY OF THE INVENTION

It is accordingly an object of the invention to provide an improved operating device, in particular for an electronic household appliance, an electronic household appliance, and a method for operating an operating device, which overcome the hereinafore-mentioned disadvantages of the heretofore-known devices, appliances and methods of this general type and which have at least one touch switch, in which an actual contact with or proximity to an operator panel can be detected more reliably.

With the foregoing and other objects in view there is provided, in accordance with the invention, an operating device, in particular for an electronic household appliance, which contains a cover plate that defines at least one operator panel for a user; at least one touch sensor system, which is assigned to each of the at least one operator panels and is configured to detect contact with the respective operator panel (e.g. by the user's fingers) or is configured to detect contact with or proximity to the respective operator panel (e.g. by the user's fingers); and a control device which is connected to the at least one touch sensor system and configured to evaluate sensor signals generated by the at least one touch sensor system. An operator panel and an associated touch sensor system each form a touch-sensitive or touch-sensitive and proximity-sensitive touch switch. According to the invention, the operating device also has at least one additional sensor system, which is disposed and configured to detect a shaking (e.g. vibration) and/or deformation of the cover plate caused by touch. The control device is also connected to this at least one additional sensor system and is further configured to evaluate sensor signals generated by the at least one additional sensor system and to combine the two evaluations of the sensor signals of the at least one touch sensor system and the at least one additional sensor system, in order to detect a contact with the at least one operator panel (to which the respective touch sensor system is assigned). The additional sensor system can in principle be disposed anywhere, i.e. in particular it does not necessarily need to be disposed in the immediate vicinity of the touch sensor system, because it can detect a shaking and/or deformation of the cover plate caused by the force on the cover plate due to being touched at any point.

Some advantageous configurations and extensions of the invention form the subject matter of the dependent claims.

The additional sensor system can be used to significantly assist the state determination performed by the touch sensor systems that are normally present, and thus improve the state determination of the operating device. Through the combined evaluation of the sensor signals of the at least one touch sensor system and the sensor signals of the at least one additional sensor system, an actual contact with the respective operator panel can be verified, a time of the contact can be verified, the contact and the proximity can be unambiguously distinguished, and by activating only one sensor system (i.e. touch sensor system or additional sensor system) it is possible to infer that a proximity (instead of a contact) or an incorrect event has occurred. Enriching the operating device with an additional sensor system to detect the force applied during the contact thus eliminates the problems described earlier in conventional operating devices and leads to high reliability in detecting contact with or proximity to an operator panel.

If the operating device has multiple operator panels on the cover plate and the operating device accordingly has multiple touch sensor systems assigned to one of the multiple operator panels, the operating device can advantageously have only a single additional sensor system for at least two of the multiple touch sensor systems. This means that fewer additional sensor systems than touch sensor systems are sufficient, which has manufacturing and cost advantages. In some cases, even a single additional sensor system can be sufficient for all touch sensor systems. As an option, the invention may also include providing a separate additional sensor system for each touch sensor system.

The at least one additional sensor system preferably includes at least one sensor element, which is selected from an acceleration sensor (for measuring the vibration directly on the cover plate or the vibration transferred from the cover plate to another component (e.g. electronics)), a load cell (for additionally measuring the force applied to the cover plate in the form of vibration and/or deflection of the cover plate), a strain gauge (for measuring the force applied to the cover plate in the form of vibration and/or deflection of the cover plate), and an optical measuring device (for measuring the force applied to the cover plate in the form of vibration and/or deflection of the cover plate).

The operating device configured in accordance with the invention can in principle contain any type of touch sensor system, but is particularly advantageous for embodiments in which the at least one touch sensor system has at least one sensor element selected from a capacitive measuring device and an optical measuring device, because on the one hand these touch sensors are structurally and economically advantageous, but on the other hand, they may function inaccurately depending on the user's environment and physical characteristics. The type of the touch sensor system is matched to the type of the cover plate or its operator panels (e.g. translucent, electrically non-conductive, . . . ) in order to detect the contact with and/or proximity to the operator panel.

The cover plate has a front side facing the user and a rear side facing away from the user. In one embodiment of the invention, the operating device also has a printed circuit board which is located behind the rear side at a distance from the cover plate, wherein the at least one touch sensor system is disposed on this printed circuit board or coupled to the printed circuit board. In this embodiment, the printed circuit board is preferably attached to the rear side of the cover plate through at least one spacer.

The at least one operator panel of the cover plate can also be preferably graphically labelled and/or illuminated to help the user to better identify the panel and distinguish between multiple panels.

With the objects of the invention in view, there is also provided an electronic household appliance having at least one above-described operating device of the invention.

The electronic household appliance is, for example, a laundry treatment machine (washing machine, tumble dryer, etc.), a dishwasher, a cooling and/or freezing appliance (refrigerator, freezer, etc.), a cooking hob or cook top, a stove, a microwave oven, a vapor extractor or the like.

With the objects of the invention in view, there is concomitantly provided a method for operating an operating device, in particular for an electronic household appliance, which has a cover plate defining at least one operator panel for a user, wherein the method comprises detecting a contact with the at least one operator panel and/or a proximity to the at least one operator panel by using at least one touch sensor system assigned to each of the at least one operator panels, and evaluating the sensor signals generated by the at least one touch sensor system. According to the invention, the method also comprises detecting a shaking and/or deformation of the cover plate caused by contact, by using at least one additional sensor system; evaluating the sensor signals generated by the at least one additional sensor system; and combining the two evaluations of the sensor signals of the at least one touch sensor system and the at least one additional sensor system, in order to detect contact with the at least one operator panel. In particular, this method is used to operate an operating device of the invention as described above. And this method according to the invention allows the advantages described above in connection with the operating device according to the invention to also be achieved.

The subject matter of the invention is defined by the attached claims. The above as well as other features and advantages of the invention can be better understood from the following exemplary description of preferred, non-restrictive exemplary embodiments by reference to the attached drawings.

Although the invention is illustrated and described herein as embodied in an operating device, in particular for an electronic household appliance, an electronic household appliance, and a method for operating an operating device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
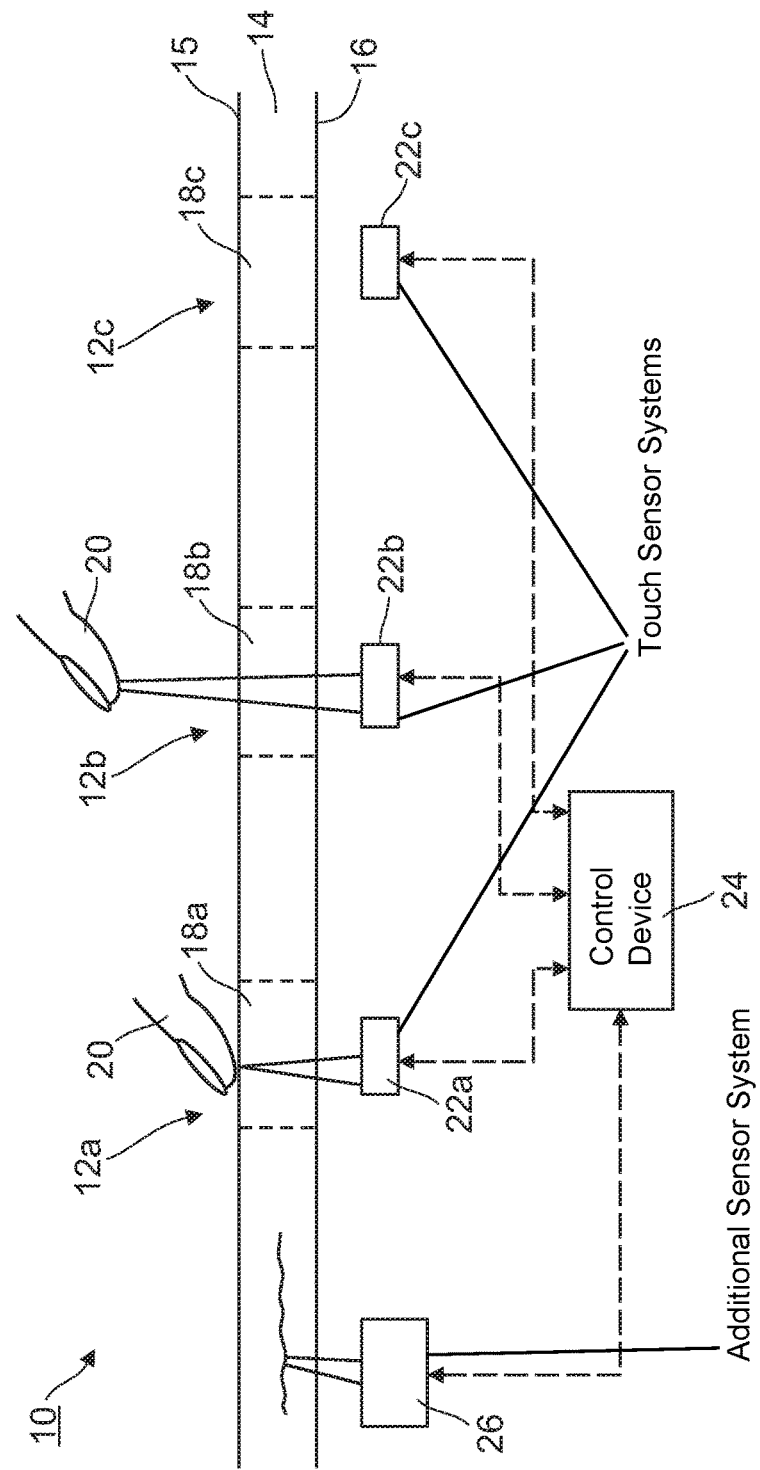
FIG. 1 is a block diagram showing the basic structure of an operating device according to an exemplary embodiment of the invention.

Referring now to the figures of the drawings in detail and first, particularly, to FIG. 1 thereof, there is seen an operating device according to the invention, which can be used, for example, on an electronic household appliance, and with which the structure and functioning of the operating device will now be described based on examples.

An operating device 10 has a cover plate 14 with a front side 15 facing the user (above the cover plate in FIG. 1) and a rear side 16 facing away from the user (below the cover plate in FIG. 1). The cover plate 14 defines at least one operator panel 18 that can be operated by the user. FIG. 1 shows three examples of operator panels 18*a*, 18*b*, 18*c*, but the operator panel 10 can also have more or fewer operator panels 18.

Each of the operator panels 18*a*, 18*b*, 18*c* is assigned a touch sensor system 22*a*, 22*b*, 22*c*. These touch sensor systems 22 are disposed on the rear side 16 of the cover plate 14 and are each configured to detect contact with the respective operator panel by the user, for example with a finger 20 (as illustrated in FIG. 1 on the operator panel 18*a*), and/or to detect an approach to the respective operator panel by the user, for example, with the finger 20 (as illustrated in FIG. 1 on the operator panel 18*b*). Alternatively, the touch sensor systems 22 can be configured only to detect contact with the respective operator panel 18. As indicated in FIG. 1, the operator panels 18*a*, 18*b*, 18*c* of the cover plate 14 and the touch sensor systems 22*a*, 22*b*, 22*c* together form a touch switch 12*a*, 12*b*, 12*c*.

The touch sensor systems 22 have capacitive or optical measuring devices, for example, but in principle can have any type of measuring device. The type of the measuring devices of the touch sensor systems 22 is adapted to the configuration of the cover plate 14, in particular its operator panels 18. For example, in translucent operator panels 18, touch sensor systems 22 with optical measuring devices can be used, or for electrically non-conductive operator panels 18, touch sensor systems 22 with capacitive measuring devices can be used.

Although not shown, the operator panels 18 of the cover plate 14 are preferably also graphically labelled, so that the user can better identify and distinguish the operator panels 18. Optionally, the touch switches 12 can also be equipped with illumination systems that enable the user to better identify and distinguish the operator panels 18 and allow information to be displayed to the user (e.g. operating status of the device, confirmation of touch detection, etc.).

The operating device 10 also has a control device 24, which is connected to the touch sensor systems 22. The control device 24 is configured to control the touch sensor systems 22 (in particular switching the operating capability on or off) and to evaluate the sensor signals generated by the touch sensor systems 22. The control device 24 can be connected to or integrated into an operating control unit of the device on which the operating device 10 is provided. The operating control unit of the device can thus control the operation of the device taking into account the user operating actions of the touch switches 12 of the operating device 10.

As shown in FIG. 1, the operating device 10 also has an additional sensor system 26. This additional sensor system 26 is configured to detect a shaking and/or deformation of the cover plate 14 caused by the user touching the cover plate 14. When the user touches an operator panel 18, a force also acts on the operator panel 18 and thus on the cover plate 14, even if this is usually not perceptible by the user. The additional sensor system 26 is able to detect this force by detecting a shaking and/or deformation of the cover plate 14.

As shown in FIG. 1, this additional sensor system 26 can in principle be disposed anywhere to detect a shaking and/or deformation of the cover plate 14, which is caused by contact with the cover plate at any point. This means that the additional sensor system 26 need not be disposed in the immediate vicinity of a touch switch 12 or its touch sensor system 22, and that an additional sensor system 26 does not need to be present for each touch switch 12 or each touch sensor system 22. This means that the operator device 10 can contain one additional sensor system 26 for each of a number of touch sensor systems 22 or only one additional sensor system 26 for all touch sensor systems 22.

The at least one additional sensor system 26 is also connected to the control device 24. And the control device 24 is also configured to evaluate the sensor signals generated by the at least one additional sensor system 26. In addition, the control device 24 combines the two evaluations of the sensor signals of the at least one touch sensor system 22 and the at least one additional sensor system 26, in order to detect contact with the at least one operator panel 18 to which the respective touch sensor system 22 is assigned. In this way, the control device 24 can verify an actual contact with the respective operator panel 18, detect the time of the contact, and unambiguously distinguish between contact with the respective operator panel and proximity to the respective operator panel. And if only one of the touch sensor system 22 and the additional sensor system 26 is activated and sends corresponding sensor signals to the control device 24, a proximity (instead of a contact) or an incorrect event can be inferred.

With reference to FIGS. 2 to 5, examples of different embodiments of the operating devices 10 will now be explained in more detail, in particular with regard to the types of touch sensor systems 22 and additional sensor systems 26. The same or corresponding components are all labelled with the same reference signs as in FIG. 1. For the sake of simplicity, FIGS. 2-5 each show only one touch switch 12 or only one touch sensor system 22 and only one additional sensor system 26, but the operating device 10 can of course, as mentioned above, also contain multiple touch switches/touch sensor systems and also multiple additional sensor systems.

In all embodiments of FIGS. 2 to 5, the operating device 10 has a printed circuit board 30, which is disposed at a distance behind the rear side 16 of the cover plate 14. The control device 24 can be mounted on this printed circuit board 30 or connected to this printed circuit board 30. The printed circuit board 30 is preferably attached to the rear side 16 of the cover plate 14 through at least one spacer 32.

Figure 2:
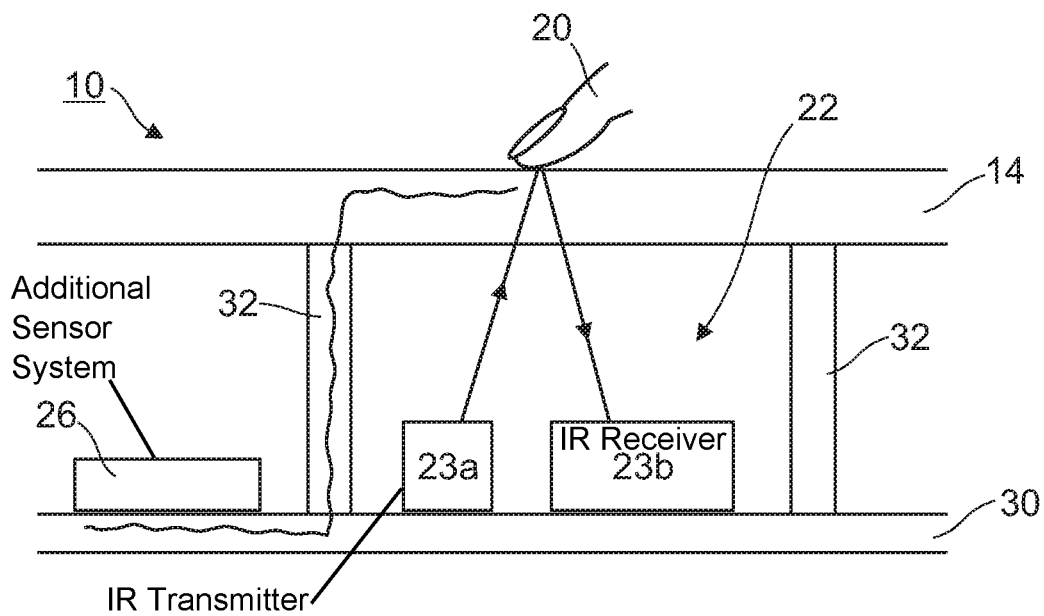
FIG. 2 is a block diagram showing a first embodiment of an operating device according to the invention.

In the embodiment of FIG. 2, the touch sensor system 22 has an optical measuring device with an IR transmitter 23a and an IR receiver 23b, which are mounted on the printed circuit board 30. If the touch sensor system 22 is configured to detect not only a contact but also a proximity, the IR receiver 23b can detect, for example, the reflected IR beam in a position-dependent manner. In the embodiment of FIG. 2, the additional sensor system 26 has a sensor element in the form of an acceleration sensor. The force introduced when the operator panel 18 of the cover plate 14 is touched causes a vibration of the cover plate 14, which is transmitted to the circuit board 30 through one or more spacers 32 and detected on the circuit board 30 by the acceleration sensor. Alternatively, the acceleration sensor can also be positioned on the rear side 16 of the cover plate 14 in order to detect the vibration of the cover plate 14 directly.

Figure 3:
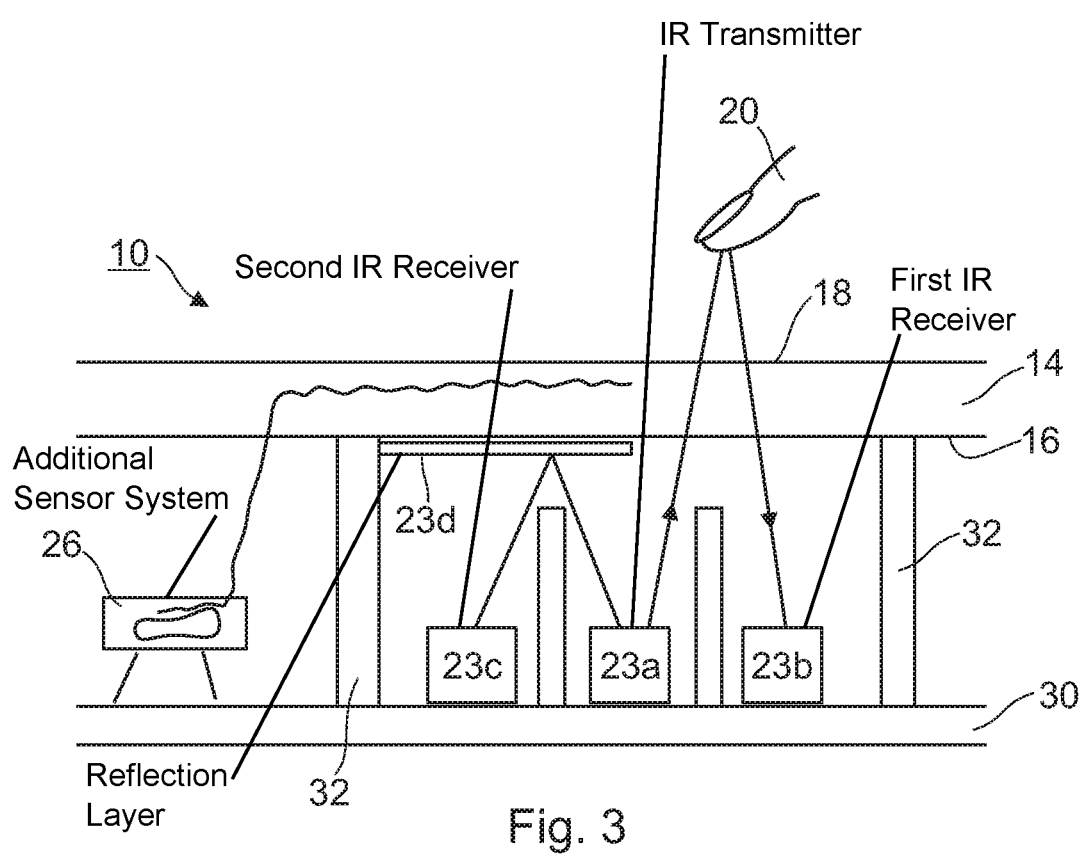
FIG. 3 is a block diagram showing a second embodiment of an operating device according to the invention.

In the embodiment of FIG. 3, the touch sensor system 22 has an optical, so-called 3-sense technology. As illustrated in the example in FIG. 3, this 3-sense touch sensor system has, in the region of an operator panel 18, a reflection layer 23d on the rear side 16 of the cover plate 14, an IR transmitter 23a, a first IR receiver 23b for detecting a proximity to or a contact with the operator panel 18 in the region next to the reflection layer 23d, and a second IR receiver 23c for detecting a pressure on the operator panel 18 in the region of the reflection layer 23d. In the embodiment of FIG. 3, the additional sensor system 26 has a sensor element in the form of a load cell. The force introduced when the operator panel 18 of the cover plate 14 is touched causes a vibration of the cover plate 14 or a pressure force equivalent to a few grams or only fractions of a gram, which can be detected by the load cell. For example, the load cell can be installed in a food processor for weighing in the feet of the food processor, wherein the force applied to the cover plate 14 of the operator panel device 10 is transmitted down to the feet of the food processor and can therefore also be detected by the load cell.

Figure 4:
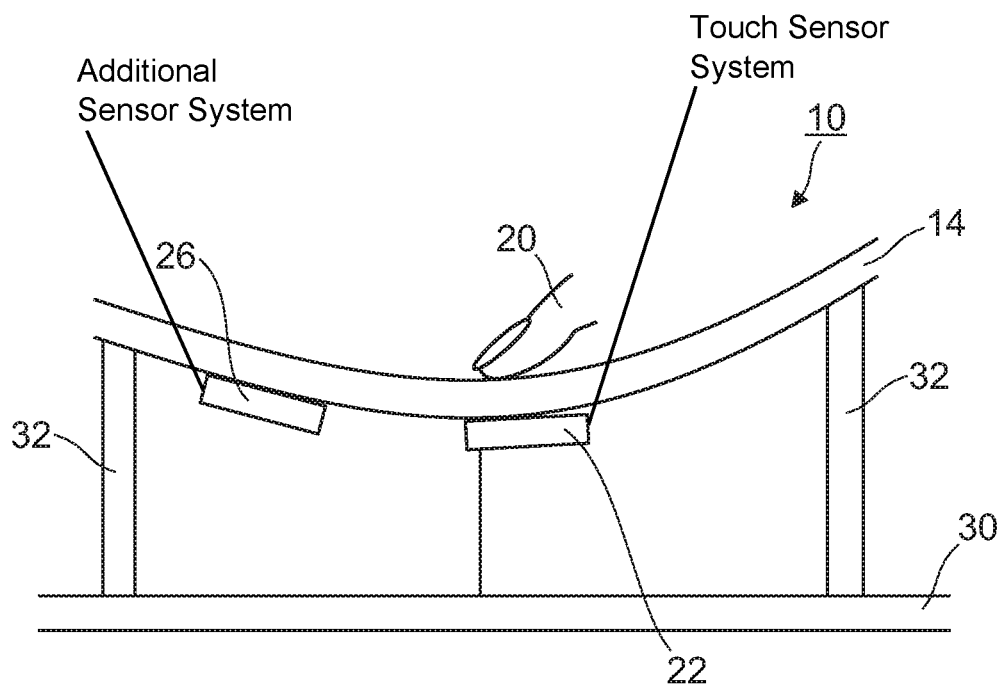
FIG. 4 is a block diagram showing a third embodiment of an operating device according to the invention.

In the embodiment of FIG. 4, the touch sensor system 22 has a capacitive measuring device which is attached to the rear side 16 of the cover plate 14 in the area of the operator panel 18 and coupled to the printed circuit board 30. In the embodiment of FIG. 4, the additional sensor system 26 has a sensor element in the form of a strain gauge, which is attached to the rear side 16 of the cover plate 14. The force introduced when the operator panel 18 of the cover plate 14 is touched causes a bending/deformation of the cover plate 14 as illustrated, which can be detected by a change in the length of the strain gauge.

Figure 5:
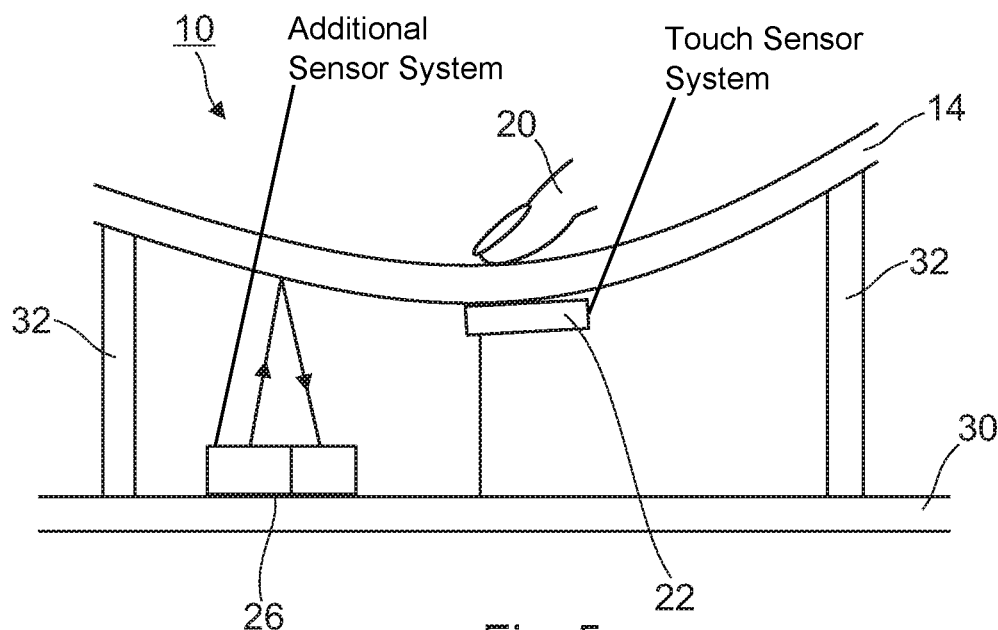
FIG. 5 is a block diagram showing a fourth embodiment of an operating device according to the invention.

In the embodiment of FIG. 5, the touch sensor system 22 has a capacitive measuring device, which is attached to the rear side 16 of the cover plate 14 in the area of the operator panel 18 and coupled to the printed circuit board 30. In the embodiment of FIG. 5, the additional sensor system 26 has a sensor element in the form of an optical measuring device mounted on the printed circuit board 30. The force introduced when the operator panel 18 of the cover plate 14 is touched causes a bending / deformation of the cover plate 14 as illustrated, which can be detected by a change in the distance to the optical measuring device.

Although not shown, other combinations of the touch sensor system 22 and the additional sensor systems 26 are also possible. In particular, all types of touch sensor systems 22 from FIGS. 2 to 5 can be combined with all types of the additional sensor systems 26 from FIGS. 2 to 5.

The subject matter of the invention is defined by the attached claims. The above-mentioned exemplary embodiments serve only to provide a better understanding of the invention, but are not intended to limit the scope of protection defined by the claims. As will be apparent to the person skilled in the art, other embodiments within the scope of the invention are also possible, in particular by omitting individual features from or adding additional features to the exemplary embodiments described above and by further (not explicitly mentioned) combinations of features of two or more of the exemplary embodiments described above.

The following is a summary list of reference numerals and the corresponding structure used in the above description of the invention.

LIST OF REFERENCE SIGNS 10 operating device
12, 12n touch switches
14 cover plate
15 front side of the cover plate
16 rear side of the cover plate
18, 18n operator panel
20 finger
22, 22n touch sensor system
23a transmitter
23b,c receiver
23d reflection layer
24 control device
26 additional sensor system
30 printed circuit board
32 spacer

The invention claimed is:

1. An operating device suitable for an electronic household appliance, the operating device comprising:
a cover plate defining a plurality of operator panels for a user, said plurality of operator panels provided on said cover plate;
a plurality of touch sensor systems each assigned to a respective one of said plurality of operator panels, said plurality of touch sensor systems configured to detect a contact or configured to detect a contact with or proximity to said respective plurality of operator panels;
a single additional sensor system for at least two of said plurality of touch sensor systems disposed and configured to detect at least one of a shaking or deformation of said cover plate caused by touch; and
a control device connected to said at least one touch sensor system and configured to evaluate sensor signals generated by said at least one touch sensor system;
said control device connected to said at least one additional sensor system, and said control device configured to evaluate sensor signals generated by said at least one additional sensor system and configured to combine evaluations of said sensor signals of said at least one touch sensor system and said at least one additional sensor system to detect a contact with said at least one operator panel.

2. The operating device according to claim 1, wherein said additional sensor system has at least one sensor element selected from a group including an acceleration sensor, a load cell, a strain gauge, and an optical measuring device.

3. The operating device according to claim 1, wherein said at least one touch sensor system has at least one sensor element selected from a group including a capacitive measuring device and an optical measuring device.

4. The operating device according to claim 1, wherein:
said cover plate has a front side facing the user and a rear side facing away from the user;
a printed circuit board is disposed behind said rear side at a distance from said cover plate; and
said at least one touch sensor system is disposed on said printed circuit board or coupled to said printed circuit board.

5. The operating device according to claim 4, which further comprises at least one spacer mounting said printed circuit board on said rear side of said cover plate.

6. An electronic household appliance, comprising at least one operating device according to claim 1.

7. A method for operating an operating device suitable for an electronic household appliance, the method comprising:
providing a household appliance having a cover plate defining a plurality of operator panels for a user, the plurality of operator panels being provided on the cover plate;
using a plurality of touch sensor systems each assigned to a respective one of said plurality of operator panels to detect at least one of contact with the at least one operator panel or proximity to the at least one operator panel;
evaluating sensor signals generated by the at least one touch sensor system;
using a single additional sensor system for at least two of said plurality of touch sensor systems to detect at least one of a shaking or deformation of the cover plate caused by touch;
evaluating sensor signals generated by the at least one additional sensor system; and
combining evaluations of the sensor signals of the at least one touch sensor system and the at least one additional sensor system to detect contact with the at least one operator panel.

* * * * *